(12) United States Patent
Huber

(10) Patent No.: US 7,633,141 B2
(45) Date of Patent: Dec. 15, 2009

(54) SEMICONDUCTOR DEVICE HAVING THROUGH CONTACT BLOCKS WITH EXTERNAL CONTACT AREAS

(75) Inventor: Erwin Huber, Munich (DE)

(73) Assignee: Infineon Technologies AG, Neubiberg (DE)

( * ) Notice: Subject to any disclaimer, the term of this patent is extended or adjusted under 35 U.S.C. 154(b) by 212 days.

(21) Appl. No.: 11/670,796

(22) Filed: Feb. 2, 2007

(65) Prior Publication Data

US 2007/0182003 A1 Aug. 9, 2007

(30) Foreign Application Priority Data

Feb. 3, 2006 (DE) ........................ 10 2006 005 420

(51) Int. Cl.
*H01L 23/495* (2006.01)
*H01L 23/48* (2006.01)
(52) U.S. Cl. ..................... 257/666; 257/676; 257/692
(58) Field of Classification Search ................. 257/666, 257/672, 675, 676, 685, 686, 698, 723, 724, 257/734, 777, 692, 693, E23.042, E23.043, 257/E23.046, E23.052, E23.061
See application file for complete search history.

(56) References Cited

U.S. PATENT DOCUMENTS

| 5,115,300 | A |  | 5/1992 | Yanagida et al. |
| 6,165,820 | A | * | 12/2000 | Pace ........................... 438/125 |
| 6,249,041 | B1 | * | 6/2001 | Kasem et al. ................ 257/666 |
| 6,873,041 | B1 |  | 3/2005 | Crowley et al. |
| 6,979,843 | B2 |  | 12/2005 | Nakajima et al. |
| 2004/0089934 | A1 | * | 5/2004 | Shimoida et al. ............ 257/686 |

* cited by examiner

*Primary Examiner*—Hung Vu
(74) *Attorney, Agent, or Firm*—Edell, Shapiro & Finnan, LLC

(57) ABSTRACT

The stackable semiconductor device includes at least one first electrode on a top side and a large-area second electrode on an underside of a semiconductor chip. The semiconductor chip also includes a control electrode on one of: the top side or the underside. Through contact blocks are arranged on the edge sides of the semiconductor device, the through contact blocks including externally accessible external contact areas. The external contact area each includes at least one edge side contact area, a top side contact area and an underside contact area. At least one large-area external contact is arranged on the underside and/or on the top side of the semiconductor device.

14 Claims, 12 Drawing Sheets

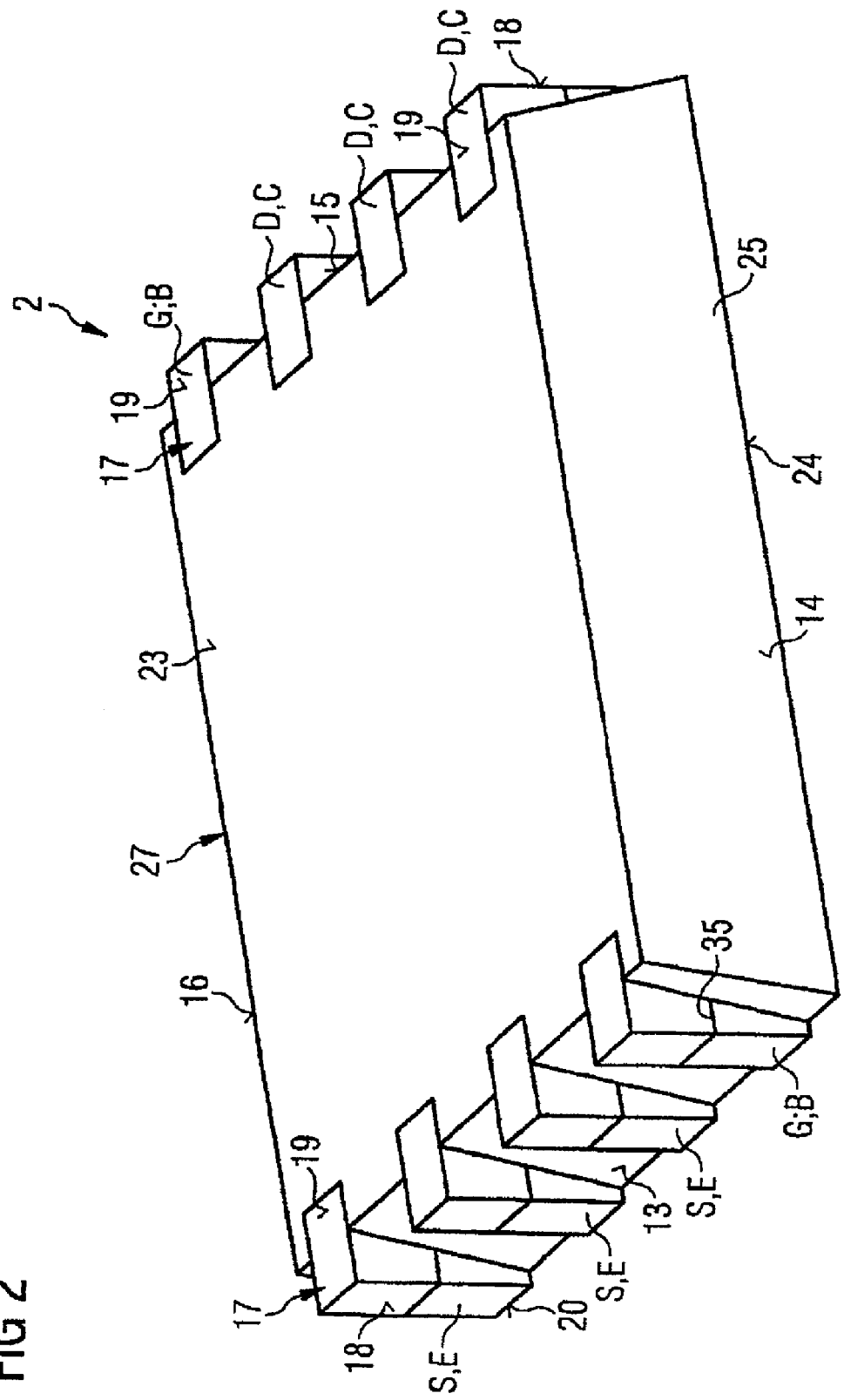

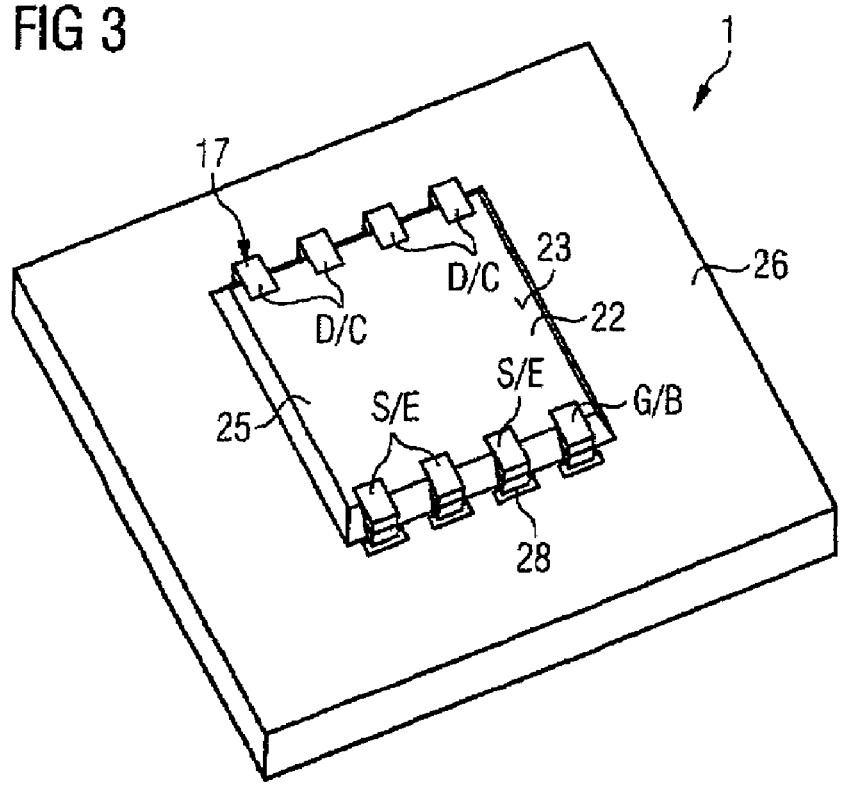
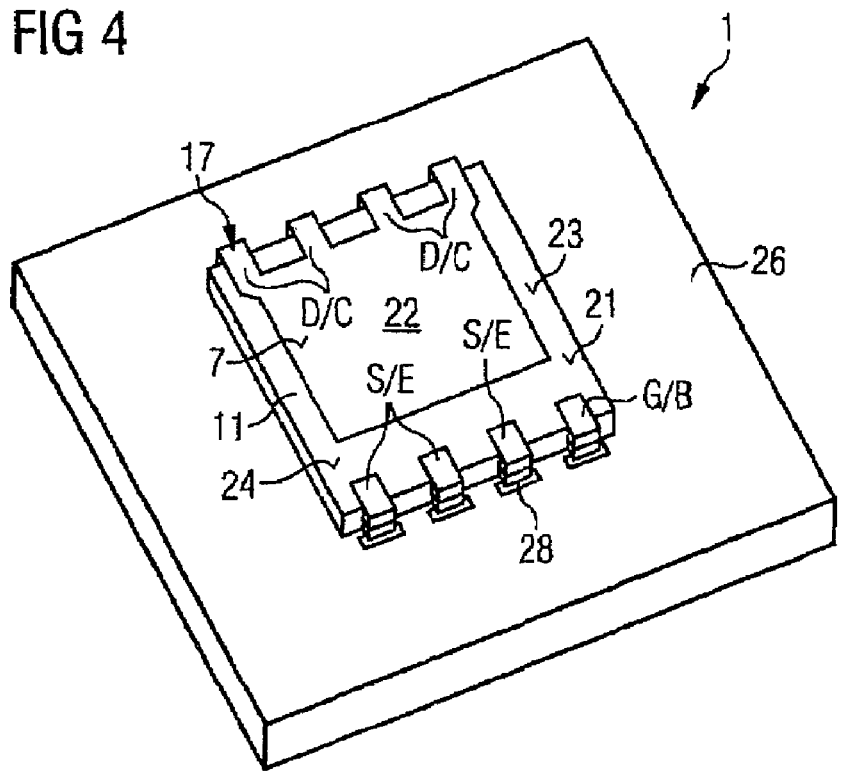

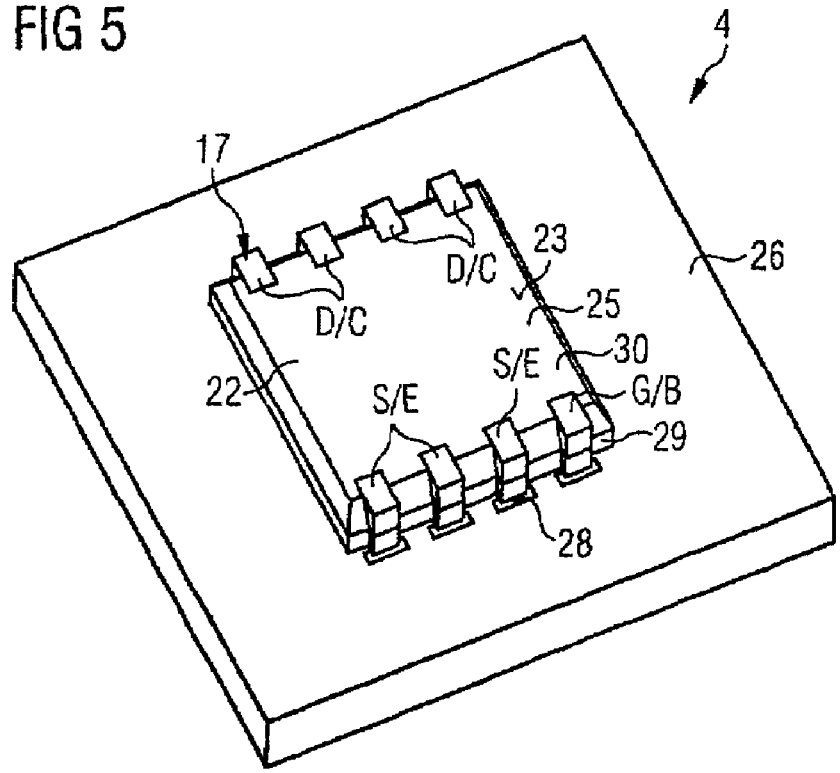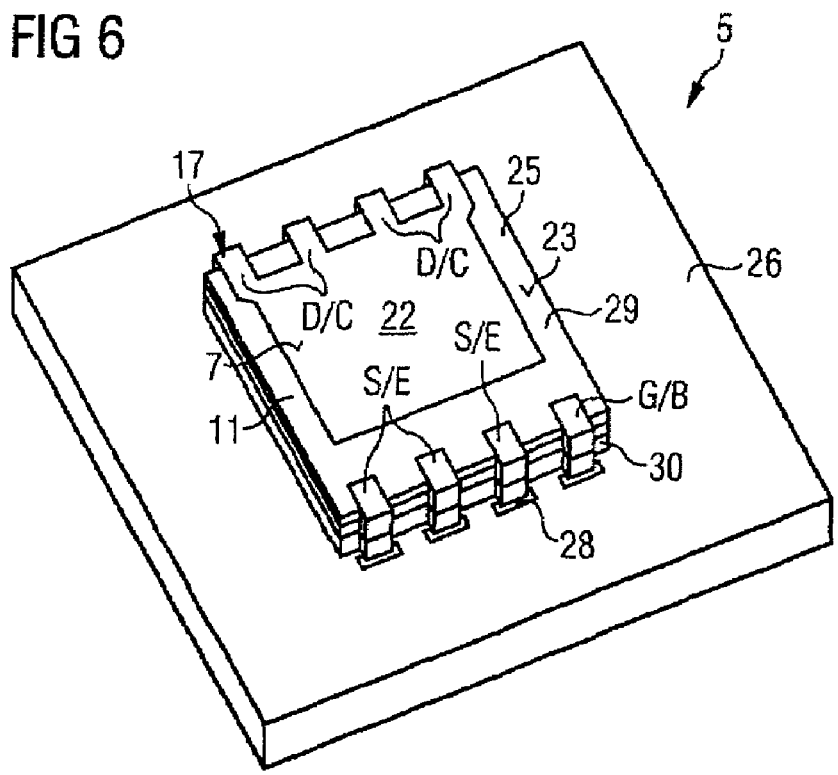

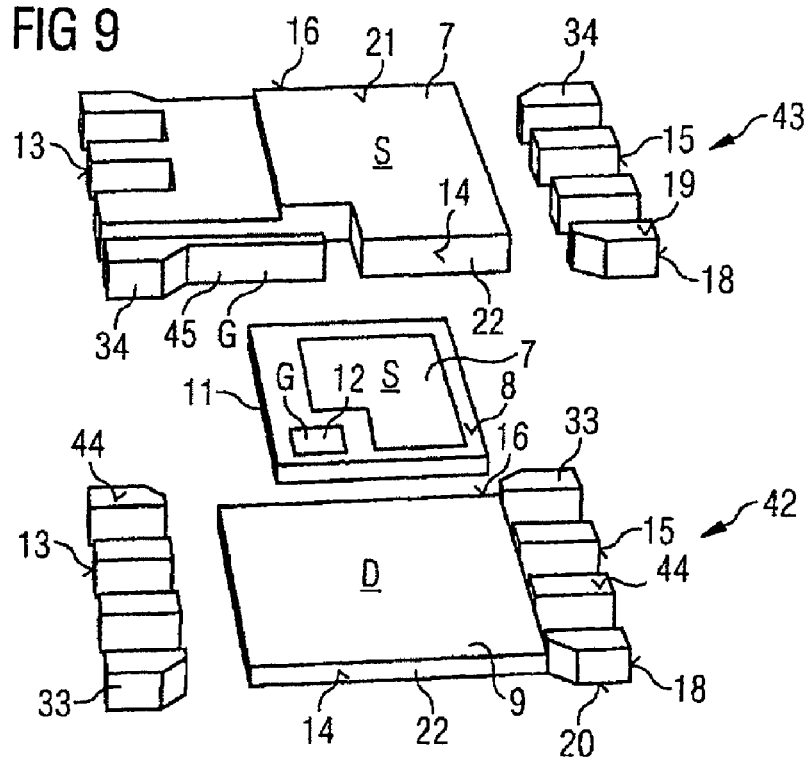
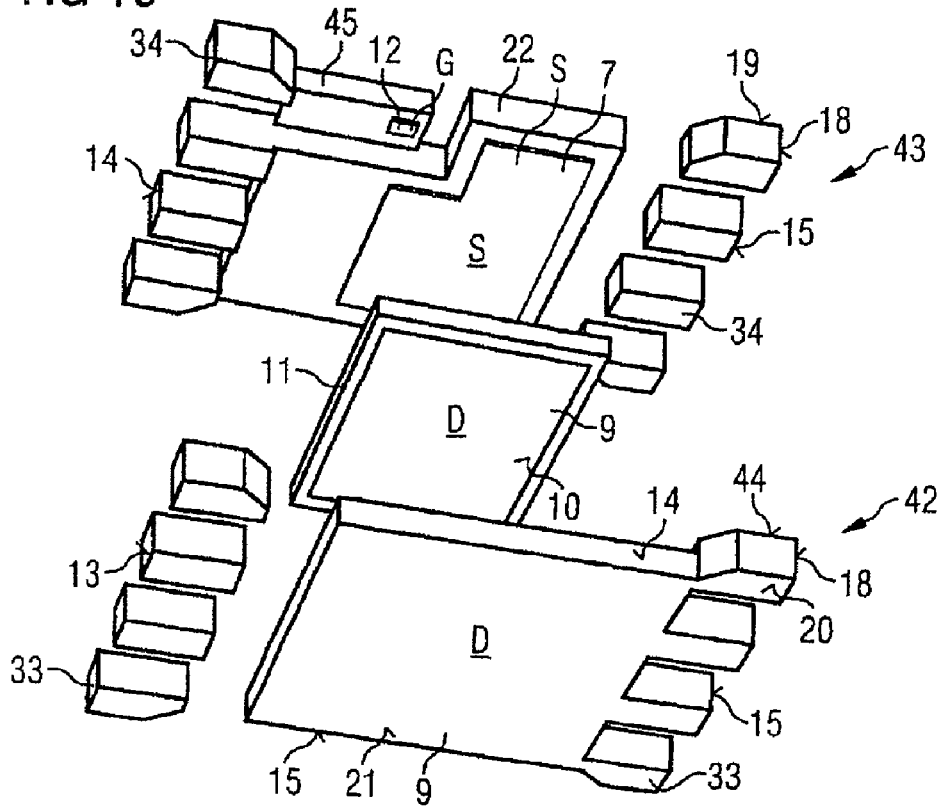

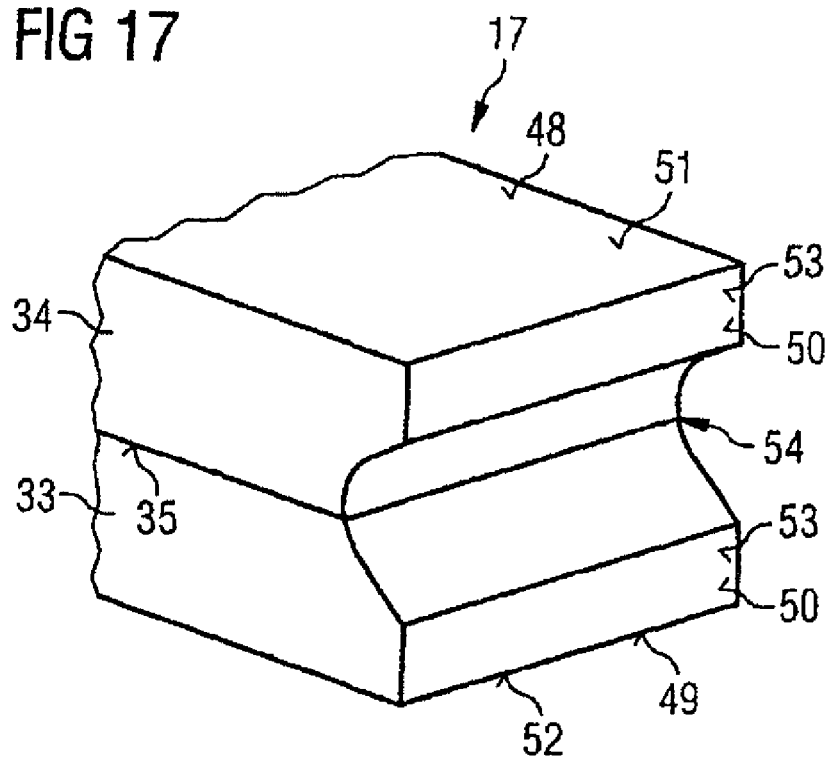
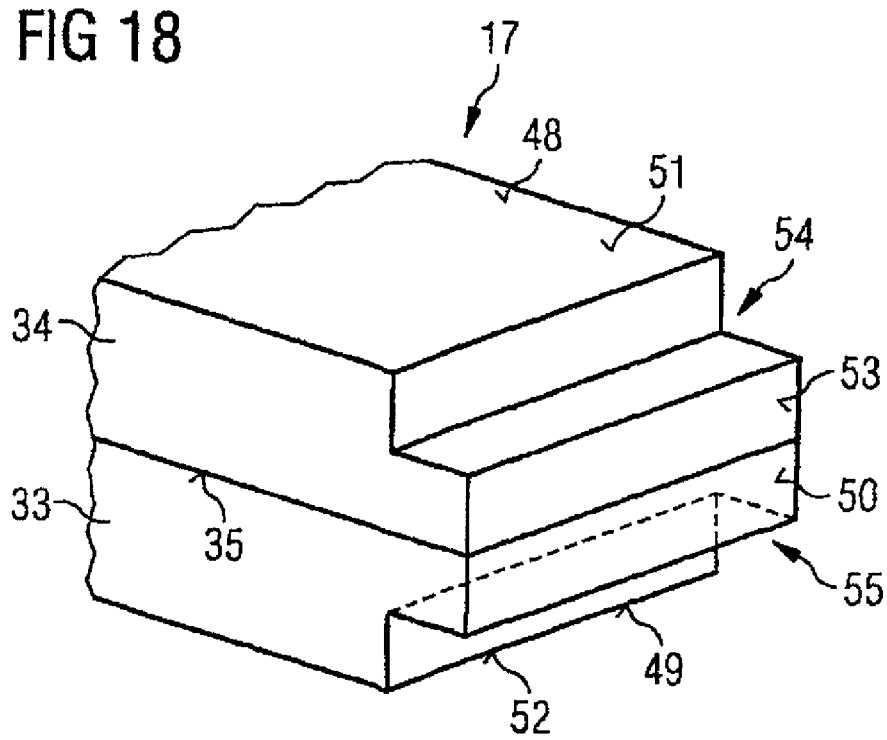

SEMICONDUCTOR DEVICE HAVING THROUGH CONTACT BLOCKS WITH EXTERNAL CONTACT AREAS

CROSS REFERENCE TO RELATED APPLICATIONS

This application claims priority under 35 U.S.C. §119 to Application No. DE 102006005420.2 filed on Feb. 3, 2006, entitled "Stackable Semiconductor Device and Method for Producing the Same," the entire contents of which are hereby incorporated by reference.

BACKGROUND

Known semiconductor devices include large-area external contact areas that extend out to a top side and to an underside of the semiconductor device. On the top side and the underside of the semiconductor device, the large-area external contact areas are connected to corresponding first and second electrodes on the underside and top side of a plastic housing embedding a semiconductor chip. These externally accessible large-area external contacts that are electrically connected to different electrodes of the semiconductor chip serve for dissipating heat from the semiconductor chip. These known large-area external contact areas on the top side and the underside of the semiconductor device are unsuitable, however, for stacking a plurality of semiconductor devices one on top of another.

There is a need, however, to configure semiconductor devices of this type compatibly with standard housings such that they are stackable. There is still a further need for the semiconductor devices to be cooled from above and/or from below. Moreover, the thermal resistance that occurs in the case of stackable housing forms should remain low both upward into the environment and downward to a superordinate circuit board. Furthermore, there is a need for stacked semiconductor devices of this type to fulfill new functions, such as e.g., half-bridges or extended coolability.

SUMMARY

The described device and method relate to a stackable semiconductor device and a method for producing the same. The stackable semiconductor device includes at least one first electrode on a top side and a large-area second electrode on an underside of a semiconductor chip. The semiconductor chip also includes a control electrode on one of: the top side or the underside. Through contact blocks are arranged on the edge sides of the semiconductor device, the through contact blocks including externally accessible external contact areas. The external contact area each includes at least one edge side contact area, a top side contact area and an underside contact area. At least one large-area external contact is arranged on the underside and/or on the top side of the semiconductor device.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The stackable semiconductor device and method for producing the same is explained in more detail below with reference to exemplary embodiments, where:

FIG. 2 shows a schematic perspective view of a second embodiment of the stackable semiconductor device;

FIG. 3 shows a schematic perspective view of the first embodiment of the stackable semiconductor device that is mounted on a superordinate circuit board;

FIG. 4 shows a schematic perspective view of the first embodiment of the semiconductor device that is mounted inversely on a superordinate circuit board;

FIG. 5 shows a schematic perspective view of a semiconductor device stack in parallel connection in accordance with a fourth embodiment;

FIG. 6 shows a schematic perspective view of a semiconductor device stack in parallel connection in accordance with a fifth embodiment;

FIGS. 9 to 14 show schematic perspective basic diagrams for the production of semiconductor devices;

FIG. 9 shows a schematic exploded perspective plan view of components provided for the production of a semiconductor device;

FIG. 10 shows a schematic exploded perspective bottom view of starting components for the production of the semiconductor device in accordance with FIG. 9;

FIG. 11 shows a schematic perspective plan view of two leadframe halves for joining together and forming a leadframe with semiconductor devices;

FIG. 12 shows a schematic perspective bottom view of two leadframe halves for joining together and forming a leadframe with semiconductor devices;

FIG. 13 shows a schematic perspective bottom view of the semiconductor device packaged into a plastic housing composition;

FIG. 14 shows a schematic perspective plan view of the semiconductor device embedded into a plastic housing composition from FIG. 13;

FIGS. 17 to 20 show different embodiments of through contact blocks with a horizontal connecting joint.

DETAILED DESCRIPTION

Figure 1:
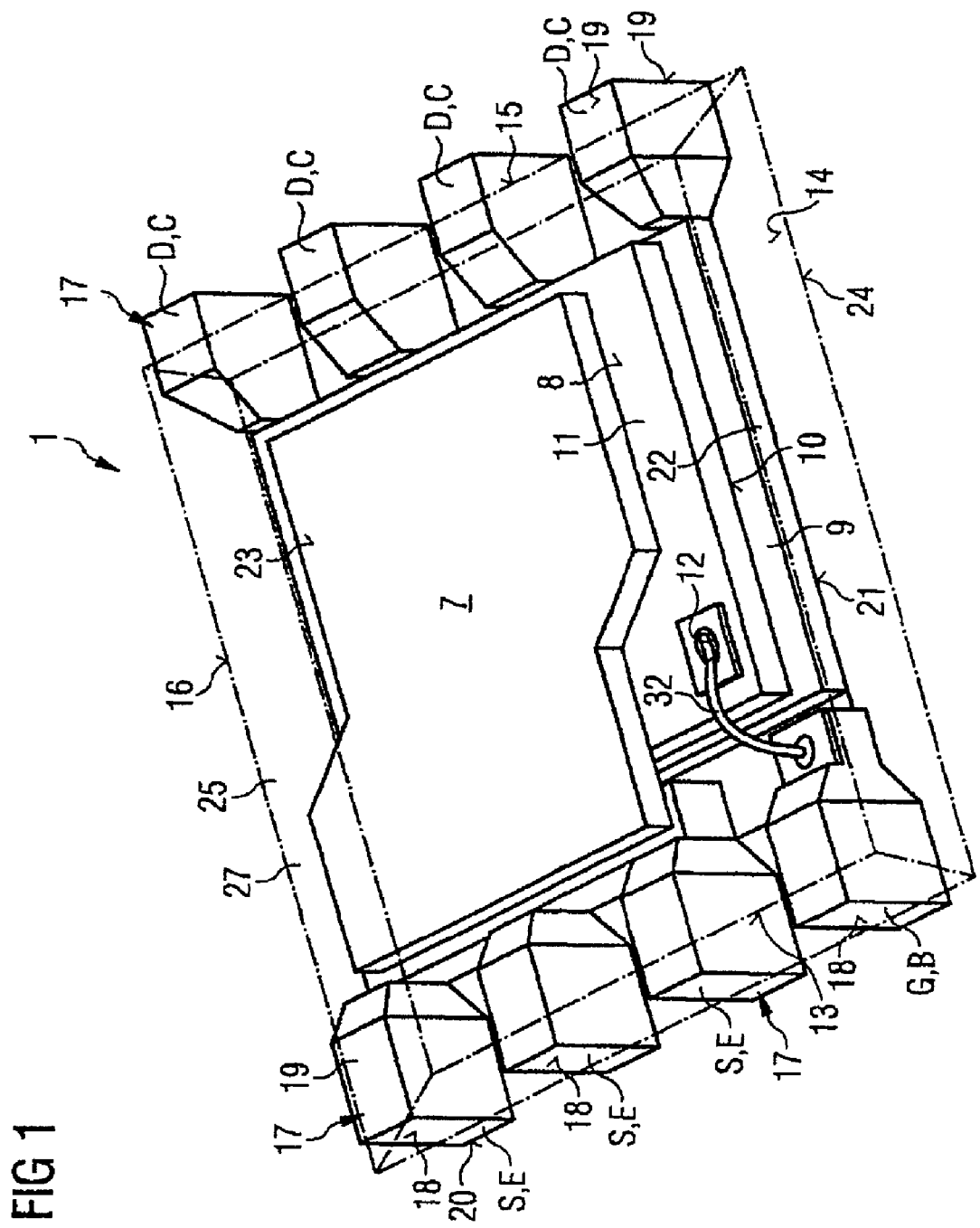
FIG. 1 shows a schematic perspective view of a first embodiment of the stackable semiconductor device.

The stackable semiconductor device, described herein, covers the demand that has arisen via, inter alia, a novel housing design. A method for producing the described device is also described herein.

The stackable semiconductor device comprises at least one first electrode on a top side and a large-area second electrode on an underside of a semiconductor chip. The semiconductor chip further comprises a control electrode on one of the sides. In order to realize the stackability, through contact blocks are arranged on the edge sides of the semiconductor device, the through contact blocks being externally accessible and having at least one edge side contact area, a top side contact area and an underside contact area as external contact areas. In addition, at least one large-area external contact is arranged on the underside and/or the top side of the semiconductor device.

A semiconductor device of this type may be both a field effect semiconductor device and also a bipolar power transistor, in which case the first and second electrodes are realized by source and drain electrodes in the case of the field effect semiconductor device, while in the case of the bipolar power transistor the large-area electrodes realize the emitter and the collector, respectively. The control electrode of semiconductor devices of this type is a gate electrode in the case of a field effect semiconductor device, while it may be a base electrode or an insulated gate electrode in the case of a bipolar power transistor.

The advantage of a stackable semiconductor device of this type is to be seen, inter alia, in the through contact blocks, which are arranged on the edge sides of the semiconductor device and are arranged compatibly with conventional standard housings. In this case, in standard housings the externally accessible contact areas are available either only on one of the sides of the semiconductor device or on a top side or a rear side and in part at the edge sides. Stacking is possible only via the through contact blocks, i.e., passage blocks, according to the invention, which are arranged on the edge sides of the semiconductor device, since they do not have external contact areas just on one side, rather it is possible to access the through contact blocks from three different sides, namely the edge sides, the top sides and the undersides.

A further advantage is also to be seen, inter alia, in the fact that the semiconductor device can be mounted both by its rear side and by its top side onto a superordinate circuit board.

Finally, these semiconductor devices enable stacking both in parallel connection and in series connection. In the case of a parallel connection, the semiconductor devices are merely stacked one above another, and their through contact blocks are aligned such that through contact blocks of the stacked semiconductor devices with identical functions can be cohesively connected one on top of another. In the case of a series connection, by contrast, the through contact blocks which are assigned to the first and to the second electrodes of the respective semiconductor chip are stacked alternately one above another, but the control electrode is to be looped through via correspondingly arranged through contact blocks of the respectively stacked semiconductor devices. This is not a problem in the case of parallel connections since the control electrodes are connected to an individual through contact block of the through contact blocks situated on the edge sides and are therefore automatically arranged one above another in the case of a stack connected in parallel.

It is more difficult, however, to realize series connections with a stackable semiconductor device of this type. For series connections, therefore, two through contact blocks are advantageously provided for the control electrode of each stackable semiconductor device, the two through contact blocks being arranged in a manner lying centrosymmetrically opposite on the edges, while the through contact blocks for the first and second electrodes of the semiconductor chip are merely positioned in a manner lying opposite one another. Such a variant of the stackable semiconductor device has the advantage, inter alia, that stacking is possible both in parallel connection and in series connection.

The at least one large-area external contact of the stackable semiconductor device makes it possible, moreover, in the case of parallel connections of the stacked semiconductor devices, to afford an intensive cooling via the large-area external contact either from the underside or from the top side of the semiconductor device stack.

In the case of both connections it is even possible, with just one external contact area per semiconductor device, to intensively cool the semiconductor device stack both from above and from below by arranging the large-area external contacts per semiconductor chip on the top side of the semiconductor device stack and on the underside of the semiconductor device stack.

In one embodiment, the first electrode of the semiconductor chip is electrically connected to at least three through contact blocks, while the control electrode is electrically connected only to one through contact block. This embodiment of the described device takes account of the fact that the control electrode is only offered a signal current or a signal potential, while a correspondingly high current is switched via the first electrode.

In a further embodiment, the second electrode of the semiconductor chip is electrically connected to at least three through contact blocks, while once again the control electrode is electrically connected only to one of the through contact blocks. Here too, there is the fundamental advantage that the control electrode only has to transmit control signals in the form of control pulses or control potentials, while a high electric current flow is passed through and switched via the second large-area electrode.

The through contact blocks of the first electrode and the through contact blocks of the second electrode can be arranged on mutually opposite edge sides. An arrangement of this type facilitates the series connection and the parallel connection when stacking semiconductor devices to form a semiconductor device stack since, in the case of series connection, it is merely necessary for the semiconductor chips to be rotated through 180° in each case with respect to one another, while the semiconductor devices can be arranged in the same orientation with respect to one another in the case of a parallel connection.

In a further embodiment, the passage blocks of one of the electrodes are electrically connected to the large-area external contact on the top side or underside of the semiconductor device. This defines from the outset which of the electrodes of the semiconductor chip can then be placed onto a cooling area and thus to ground. For this purpose, the large-area external contact is thermally operatively connected to a heat sink.

A method for producing a plurality of stackable semiconductor devices comprising at least one first electrode on a top side and a large-area second electrode on an underside of a semiconductor chip includes the following method steps.

First, a leadframe is produced with semiconductor positions arranged in rows and columns, the leadframe having a lower leadframe half with lower through contact block halves and an upper leadframe half with upper through contact block halves in the semiconductor device positions. The through contact block halves on each of the leadframe halves are provided for through contact blocks on the edge sides of the semiconductor device. Moreover, in the semiconductor device positions, at least one large-area contact on each of the leadframe halves is provided for receiving a semiconductor chip.

Semiconductor chips are produced alongside the leadframe halves. The semiconductor chips comprise at least one first electrode on a top side and a large-area second electrode on an underside of the semiconductor chip. If enough semiconductor chips and leadframe halves are available, then the lower leadframe halves are first applied with semiconductor chips with application of one of the large-area electrodes of the semiconductor chips to the large-area external contact in the semiconductor device positions of the leadframe halves. Thereafter, the upper leadframe half is aligned with the lower leadframe half and, after the positioning of the semiconductor chips between the leadframe halves, the latter are cohesively connected to one another.

The cohesive connection involves not only cohesively connecting the leadframe halves to the top side and underside of the power semiconductor chip, but also joining together the through contact block halves in the edge regions of the semiconductor chip positions of the leadframe to form external contact blocks. In addition, a control electrode is connected to one of the through contact blocks at least on an edge side of the leadframe in the semiconductor devices. After this assembly of the semiconductor chips with the leadframe halves and the through contact block halves, the semiconductor chips with the electrical connections of the leadframe halves are joined together in a plastic housing composition while leaving free the edge side contact areas, the top side contact areas and also underside contact areas of the through contact block halves. Moreover, the large-area external contact areas are likewise kept free of plastic housing composition. Subsequently, the leadframe can then be separated into individual stackable semiconductor devices.

This method has the advantage, inter alia, that with suitable leadframe halves, through contact blocks are fixed in the edge sides of a plastic housing in the individual semiconductor device positions, and stackable semiconductor devices can be realized via simple and inexpensive manufacturing methods. A further advantage of this method is that not only is it possible to individually realize an individual stackable semiconductor device, but it is also possible to produce a plurality of stackable semiconductor devices in parallel in few manufacturing steps on a leadframe including corresponding semiconductor chip device positions arranged in rows and/or columns.

In one embodiment, the semiconductor chips are first diffusion-soldered on the lower leadframe half in the semiconductor device positions and the remaining soldering connections to the upper leadframe half are subsequently soldered on using a lead-free solder. This method variant has the advantage, inter alia, that the connection of the semiconductor chips to the lower leadframe half is resistant to high temperatures as a result of the intermetallic phases that form, with the result that subsequent joining methods do not detach the semiconductor chip from the lower leadframe half.

Instead of individual successive joining steps of the different components to form a leadframe made from leadframe halves with semiconductor chips arranged in between, a stack is first formed from a lower leadframe half, semiconductor chips and an upper leadframe half and the stack is subsequently joined together. When joining together a stack of this type, it is also possible to use a conductive adhesive, so that the individual components of the stack such as leadframe halves, contact block halves and semiconductor chips are adhesively bonded together and contact-connected.

On the other hand, it is also possible to carry out diffusion soldering for all the bonding joints when joining together the stack. This results in a semiconductor device comprising connecting joints that are correspondingly resistant to high temperatures. If stringent requirements are not made of the temperature resistance, then it is also possible for the entire stack to be soldered together via lead-free solder material. This method has the advantage, inter alia, that it is possible to dispense with so-called "clip" holders for the construction of the semiconductor components.

To summarize, it can be established that the number of variants for stock keeping can be restricted and reduced by virtue of the fact that with the stackable semiconductor device, a multifunctional device is present which can replace a multiplicity of housing variants. Furthermore, with the stackable semiconductor device, a smaller space requirement on the circuit is realized by utilizing the height in the direction of the third dimension. In addition, the user can recursively assemble this housing one above another using standard processes, where it is merely necessary to carry out renewed solder paste applications with subsequent renewed placement and, finally, a standard soldering process can be effected.

Stackable semiconductor devices of this type can be preconfigured for a user, so that the user can process the stack like a conventional device via a single step. A further advantage of the solution according to the described device is that the dissipation of heat can be controlled by the compact housing design and is improved by shaping and optimizing the leadframe and the plastic housing composition. The thermal linking of a heat sink is improved via the large-area external contacts in the case of the housings that can be cooled on one side with the stackable semiconductor device.

Moreover, it is possible to produce MOSFETs and bipolar transistors with totally new properties. Thus, it is possible, e.g., to combine a first MOSFET having a low turn-on threshold and a relatively high resistance and having low gate charging with a second MOSFET having a higher turn-on threshold and a lower resistance and greater gate charging in order to minimize the switching losses. Moreover, it is possible to match the power loss to the location of the greatest heat dissipation or the largest thermal sink such that, e.g., in the case of cooling on both sides, the upper semiconductor device is furnished with a lower on resistance, and the currents are divided inversely proportionally to the on resistance, the higher power loss arising in the upper device, which can be cooled directly via heat sinks.

Furthermore, via the described stackable semiconductor device, it is possible to utilize the heat flow within a stack for enabling higher temperatures than are provided for a superordinate circuit board to be permitted in the arrangement of the stacked semiconductor devices by virtue of the upper semiconductor device being heated thermally beyond the maximum permissible range of the circuit board temperature. Surface mount technology can advantageously be used in this case. Furthermore, it is possible to optionally emit the power loss upward and/or downward and to correspondingly increase the power density of the circuit.

A further aspect of the described device relates to a semiconductor component comprising an integrated circuit. In this case, the semiconductor component is stackable and includes a semiconductor chip. The semiconductor chip comprises at least one first electrode on its top side and a large-area second electrode on its underside. The semiconductor chip further comprises a control electrode on one of the sides. Through contact blocks are arranged on the edge sides of the semiconductor device, the through contact blocks including externally accessible external contact areas. The external contact areas each comprising: at least one edge side contact area, a top side contact area and an underside contact area. The semiconductor device further comprising at least one large-area external contact (22) arranged on the underside (24) and/or the top side (23) of the semiconductor device.

The semiconductor device can be a power semiconductor module, wherein the power semiconductor module comprises large-area contacts both on the top side and on the rear side.

Furthermore, the described device relates to a hybrid circuit component which includes through contact blocks on its edge sides, the through contact blocks comprising, externally accessible external contact areas. The external contact areas each comprising: at least one edge side contact area, a top side contact area and an underside contact area. In this case, at least one large-area external contact is arranged on the underside and/or the top side of the hybrid circuit component.

A semiconductor component stack with passive components arranged on its top side can be constructed from the semiconductor devices described above.

In the following paragraphs, exemplary embodiments of the device and method are described in connection with the figures.

FIG. 1 shows a schematic perspective view of a stackable semiconductor device 1 of a first embodiment of the invention. To improve clarity, the contour of the plastic housing 27 is identified by dash-dotted lines and the inherently non-transparent plastic housing composition 25 is illustrated in transparent fashion. Through contact blocks 17 are arranged at the edge sides 13 and 15 of the plastic housing 27 in the plastic housing composition 25, the through contact blocks projecting into the plastic housing composition 25 such that edge side contact areas 18, top side contact areas 19 and underside contact areas 20 are free of plastic housing composition and can thus be contact-connected externally. On the edge side 13, three through contact blocks 17 are jointly connected to a first electrode 7 on the top side 8 of the semiconductor chip 11.

These three through contact blocks 17 of the edge side 13 are jointly assigned to a source electrode S in the case of a field effect power device or to an emitter electrode E in the case of a bipolar power transistor. The fourth through contact block 17 is connected via a bonding wire 32 to a control electrode 12 on the top side 8 of the semiconductor chip 11. Consequently, for this through contact block 17 of the edge side 13, it is possible to achieve a gate electrode G in the case of a field effect power device and a base electrode B in the case of a bipolar transistor.

The opposite edge side 15 of the plastic housing 27 includes four further through contact blocks 17, which are jointly connected to a large-area second electrode 9 on the underside 24 of the semiconductor device 1. The second electrode 9 is formed by a large-area external contact 22 that carries a semiconductor chip 11 by the underside 10 thereof within the plastic housing composition 25. The second electrode 9 is a drain electrode D in the case of the field effect power device and a collector electrode C in the case of a bipolar power transistor. While the first electrode 7 of this embodiment on the top side 8 of the semiconductor chip 11 is surrounded by the plastic housing composition 25, the large-area external contact 22 is free of plastic housing composition in the region of an external contact area 21, so that the external contact area 21 can be contact-connected from the underside 24 of the semiconductor device 1. On a semiconductor device 1 of this type it is possible to stack an identical semiconductor device, thereby practically achieving a parallel and/or series connection of two semiconductor devices.

The stack of the semiconductor devices 1 can be enlarged as desired, but the thermal loading of the topmost semiconductor device will increase as the stack height increases. On the other hand, the stacking also enables an advantage to be achieved by exhausting the full permissible thermal loadability of an upper semiconductor device 1, which lies approximately at 175° C., while a circuit board on which a semiconductor stack of this type is mounted only has a maximum permissible temperature of 105° C. Consequently, the bottommost semiconductor device of the stacked semiconductor devices can only be operated up to a temperature of 105° C., while the semiconductor devices stacked above it can be loaded increasingly with higher permissible temperatures without jeopardizing the circuit board or the semiconductor devices.

FIG. 2 shows a schematic perspective view of a stackable semiconductor device 2 of a second embodiment. Components having the same functions as in FIG. 1 are identified by the same reference symbols and are not explained separately.

FIG. 2 shows the top side 23 of the semiconductor device 2 and also the edge sides 13 and 15 with the corresponding through contact blocks 17, of which the plastic-free areas that can be accessed externally can be seen, such as the edge side contact area 18, the top side contact area 19 and the underside contact area 20. The difference with respect to the first embodiment consists in the fact that a semiconductor device 2 which can be connected to a second, third or else a fourth semiconductor device in a stack both in parallel and in series is present in this case.

The semiconductor device comprises, in the diagonally opposite corner regions of the edge sides 13 and 15, in each case a through contact block 17 which is connected to the gate electrode G in the case of a field effect power transistor or to a base electrode B in the case of a bipolar power transistor. It is thus possible to realize both series and parallel connections with this stackable semiconductor device 2.

FIG. 3 shows a schematic perspective view of a semiconductor device 1 of the first embodiment that is mounted on a superordinate circuit board 26. For this purpose, the superordinate circuit board 26 includes corresponding contact pads 28 which correspond in terms of size and arrangement to the underside contact areas of the semiconductor device 1. The large-area external contact 22, arranged here on the underside of the surface-mounted semiconductor device 1, is thus cooled by the superordinate circuit board 26. For more intensive cooling, it may also be provided that a particular heat sink is arranged on this top side external contact that is not shown in this illustration.

FIG. 4 shows a schematic perspective view of a semiconductor device 1 of the first embodiment that is mounted inversely on a superordinate circuit board 26. This semiconductor device 1 can now be cooled on the freely accessible underside 24—situated at the top—of the semiconductor device 1 via a heat sink being arranged on the freely accessible large-area external contact area 21. In this case, the large-area external contact 22 is connected to four through contact blocks 17 on the edge side 15. Internally, the through contact blocks 17 on the edge side 15 are operatively connected to a drain electrode in the case of a field effect power transistor and are connected to a collector in the case of a bipolar power transistor.

FIG. 5 shows a schematic perspective view of a semiconductor stack 4 in parallel connection in accordance with a fourth embodiment. In this case, the parallel connection relates to two stacked semiconductor devices 29 and 30. In this case, the upper semiconductor device 30 is oriented with its through contact blocks 17 in the same way as the underlying semiconductor device 29 that is surface-mounted directly on the circuit board. Consequently, the semiconductor device 4 constitutes a stack of semiconductor 5 devices 29 and 30 connected in parallel and is cooled by the circuit board 26. A construction of this type permits the additional heating of the stacked semiconductor device 30 to be higher than the semiconductor device 29 cooled directly by the superordinate circuit board 26. In this respect, an estimation of the electrical properties yields approximately the following values:

| | |
|---|---|
| 1. Drain-source on resistance of a low-voltage MOSFET in the form of a semiconductor chip | 1.5 ... 2.0 mΩ |
| 2. Housing resistance of a housing (e.g. SUPER SO8, Power-Pak ™ S08) | 0.2 mΩ |
| 3. Resistance between the housings | 0.2 mΩ |
| 4. Parallel connection of two devices | 0.95 ... 1.3 mΩ |
| 5. Parallel connection of three devices | 0.55 ... 0.75 mΩ |

The following were determined as thermal values for this arrangement:

| | |
|---|---|
| 1. Maximum temperature of the semiconductor | $T_j$ 150 ... 175° C. |
| 2. Maximum temperature of the circuit board | 105° C. |
| 3. Semiconductor-housing contact resistance | Rth jc 1 K/W |
| 4. Housing contact resistance (upper housing to lower housing) | Rth cc <10 K/W |
| 5. Thermal resistance of a circuit board (four-layered with 35 μm copper coating) | 15 20 K/W |
| 6. Maximum power loss of a device circuit board junction (Ta = 35°) | 6.5 ... 5 W |
| 7. Maximum power loss of a parallel connection of two or more devices | 6.5 ... 5 W |
| 8. Maximum Tj for different numbers of devices one above another: | |
| Standard device, $T_j$ | 110 ... 111.5° C. |
| Parallel connection of two devices | |
| $T_j$ lower device | 110 ... 111.5° C. |
| $T_j$ upper device | <140° C. |
| Parallel connection of three devices | |
| $T_j$ lower device | 110 ... 115.5° C. |
| $T_j$ middle device | <150° C. |
| $T_j$ upper device | <170° C. |

In this case, the maximum power loss of a semiconductor device 1 that can be emitted to the circuit board 26 is to a first approximation dependent only on the size of the contact pad 28. Conventional semiconductor devices and stacked semiconductor designs have an identical bottom area, that is to say always the same heat emission as well. In the case of three identical devices one above another, the current will not be distributed uniformly. First, the resistance increases for each additionally stacked device and second a negative feedback arises as a result of a greater heating of the topmost semiconductor device by virtue of first of all the temperature rising and hence the electrical resistance rising and consequently the current flow for its part decreasing, resulting in a decrease in temperature. Consequently, a relatively uniform temperature distribution is thereby achieved despite the stacking.

FIG. 6 shows a schematic perspective view of a semiconductor device stack 5 in parallel connection in accordance with a fifth embodiment. In this case, in contrast to the fourth embodiment, the semiconductor device stack 5 is stacked inversely on the superordinate circuit board 26, so that the large-area external contact 22 is freely accessible and the semiconductor device stack of the fifth embodiment can be significantly cooled from above in a highly efficient manner. For this purpose, in addition, a heat sink can be fitted to the large-area external contact area 21. In the case of a MOSFET semiconductor device stack, the large-area external contact 22 is connected to a drain electrode of a semiconductor chip, and in the case of a bipolar power transistor, the large-area external contact 22 is electrically connected to an emitter electrode. At the same time, four passage contact blocks 17 arranged on the edge side 15 are electrically connected to the large-area external contact 22.

Figure 7:
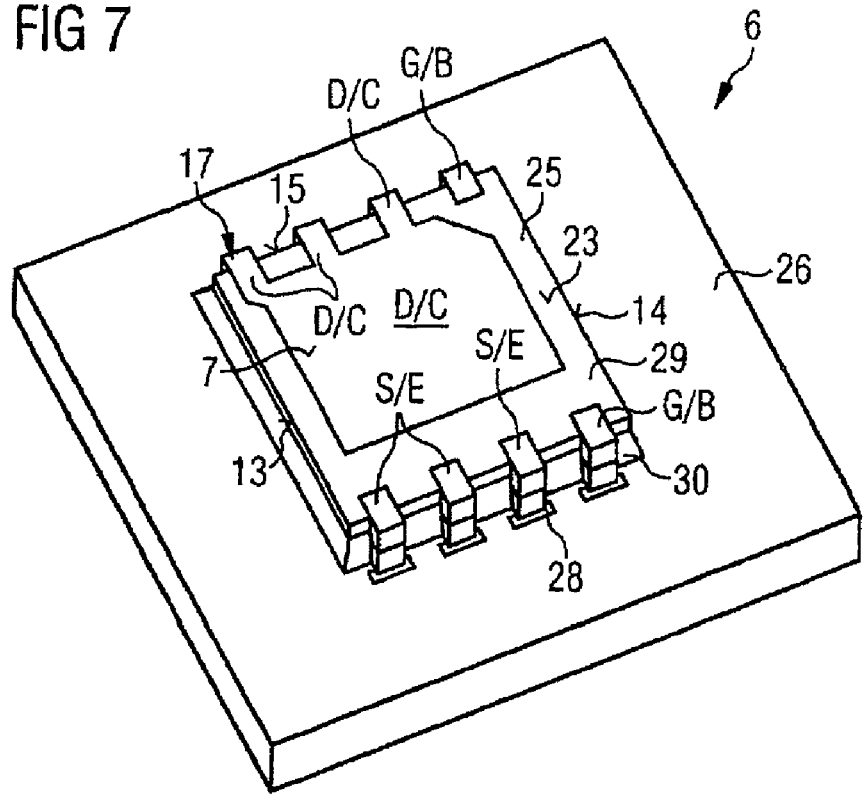
FIG. 7 shows a schematic perspective view of a semiconductor device stack in series connection in accordance with a sixth embodiment.

FIG. 7 shows a schematic perspective view of a semiconductor device 6 in series connection in accordance with a sixth embodiment. In order to realize a series connection of this type, the passage contact blocks 17 are arranged such that only three passage contact blocks 17 on two opposite edge sides 13 and 15 of the semiconductor devices 29 and 30 are connected to the corresponding large-area electrodes.

The fourth through contact block 17 on the edge sides 13 and 15 is connected to the control electrode of the corresponding stacked semiconductor chip 29 and 30 and is electrically connected to the respective control electrode of the stacked semiconductor devices 29 and 30 by two diagonally opposite and hence centrosymmetrically arranged through contact blocks 17. A series connection of this type cannot be realized without a reconfiguration of the leadframe in the stackable semiconductor devices 29 and 30.

Figure 8:
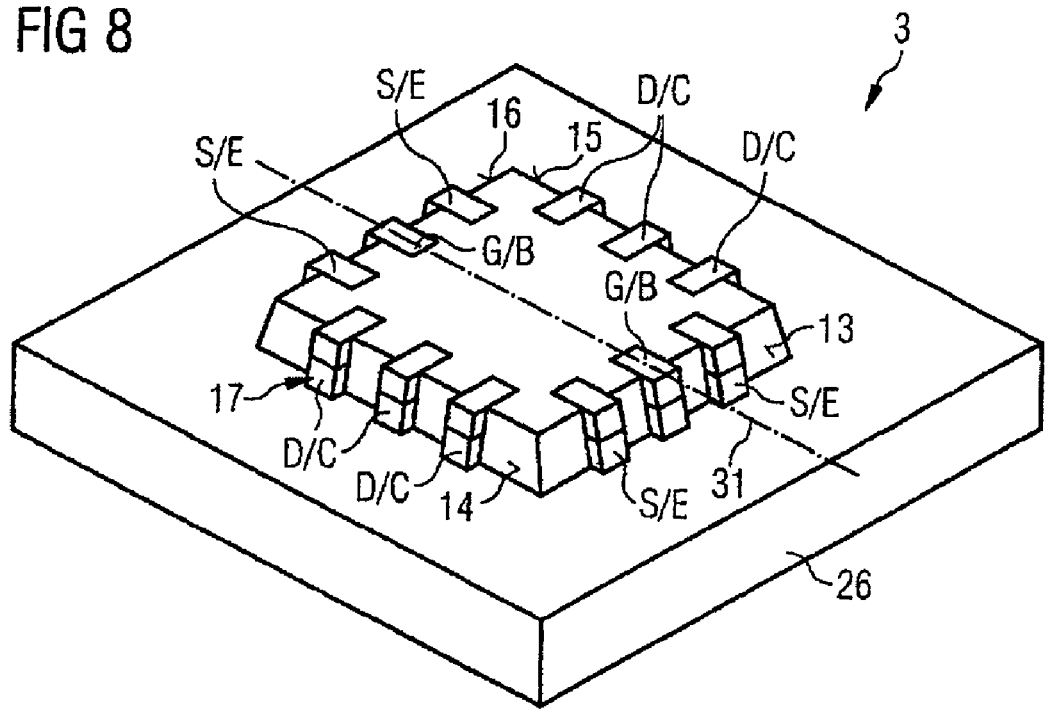
FIG. 8 shows a schematic perspective view of a special form of a semiconductor device stack in accordance with a third embodiment.

FIG. 8 shows a schematic perspective view of a special form of a semiconductor device stack 3 in accordance with a third embodiment. The basis of this special form is a so-called QFN housing, in which in each case three through contact blocks 17 are arranged on each edge side 13, 14, 15 and 16. In this case, the through contact blocks 17 are arranged mirror-symmetrically about an axis 31 of symmetry, which is indicated here by a dash-dotted line, a through contact block 17 being arranged on the axis 31 of symmetry in each case on the edge sides 14 and 16, so that the control electrode is connected to the through contact blocks 17 at two points on the axis 31 of symmetry.

Through contact blocks 17 which interact with the first electrode are arranged on one side of the axis 31 of symmetry, and through contact blocks 17 which are electrically and operatively connected to the second electrode are arranged on the opposite side of the axis 31 of symmetry. This affords the possibility of being able to stack as many of such semiconductor devices 3 of the third embodiment of the invention as desired one above another, both in parallel connection and in series connection.

FIGS. 9 to 14 show schematic perspective basic diagrams for the production of semiconductor devices.

FIG. 9 shows a schematic exploded perspective plan view of starting components for the production of a semiconductor device. The starting components comprise a lower electrode structure 42 and an upper electrode structure 43 and a semiconductor chip 11 arranged in between. The lower electrode structure 42 has a large-area external contact 22, provided as drain electrode D. The large-area external contact 22 is electrically connected to four lower through contact block halves 33 at an edge side 15.

The thickness of the lower through contact block halves 33 is greater than the thickness of the large-area external contact 22, so that the semiconductor chip 11 can be positioned with a rear-side drain contact on the large-area external contact 22, without projecting above the lower through contact block halves 33. As a result, it is possible to apply the upper electrode structure 43 to the coplanar area composed of the top side 8 of the semiconductor chip 11 and the top sides 44 of the lower through contact block halves 33.

The upper electrode structure 43 likewise includes a large-area external contact 22, which, however, is adapted in terms of its areal extent to the source electrode S of the semiconductor chip 11. Furthermore, the upper electrode structure 43 includes a gate electrode G adapted in terms of its size to the control electrode 12 of the semiconductor chip 11. At the edge sides 13 and 15, the upper electrode structure 43 comprises upper through contact block halves 34. Of the latter, the upper through contact block halves 34 on the edge side 15 are adapted in terms of size, structure and arrangement to the lower contact block halves 33 of the lower electrode structure 42, so that through contact blocks 17 with a horizontal connecting joint 35 arise when the lower electrode structure 42 is joined together with the upper electrode structure 43. The upper through contact block halves 34 on the edge sides 13 and 15 are in part electrically connected to the large-area external contact 22 for the source electrode S. At least one of the upper through contact block halves 34 is electrically in contact with the control electrode 12 via a gate connection line 45.

The lower electrode structure 42 having the reduced thickness of the large-area external contact 22 by comparison with the lower through contact block halves 33 can be produced by a procedure in which the lower electrode structure 42 that is stamped out in a leadframe is thinned by etching in the region of the large-area external contact 22 in order to prepare enough space for the semiconductor chip 11. The further assembly of the components to form a semiconductor device is shown by FIGS. 11 and 12.

FIG. 10 shows a schematic exploded perspective bottom view of starting components for the production of the semiconductor device in accordance with FIG. 9. Components having the same functions as in FIG. 9 are identified by the same reference symbols and are not discussed separately. In this exploded bottom view, in the lower electrode structure 42, the large-area external contact 22 is connected to the underside 10 of the semiconductor chip 11, so that the large-area external contact 22 forms the drain electrode D in interaction with the four lower through contact block halves 33 on the edge region 15.

Lying opposite the edge region 15 is the edge region 13, which likewise comprises lower through contact block halves 33, which, however, are reserved for a connection to upper through contact block halves 34 and are not electrically connected to the lower large-area external contact 22. The difference between the two embodiments of the semiconductor device components between FIG. 9 and FIG. 10 is that in order to accommodate the semiconductor chip 11 both in the lower electrode structure 42 and in the upper electrode structure 43 in the region of the semiconductor chip positions, the large-area external contacts 22 are thinned by etching in terms of their thickness by comparison with the through contact block halves 33 and 34, whereas in FIG. 9 only the lower electrode structure 42 was thinned by etching. In both embodiments, however, a connecting joint is provided which cohesively connects the lower and upper through contact block halves 33 and 34 to one another to form through contact blocks 17 as external contacts of the semiconductor device 46. Such a cohesive connection can be achieved via conductive adhesives, via lead-free solder materials and/or by diffusion soldering.

Figure 11:
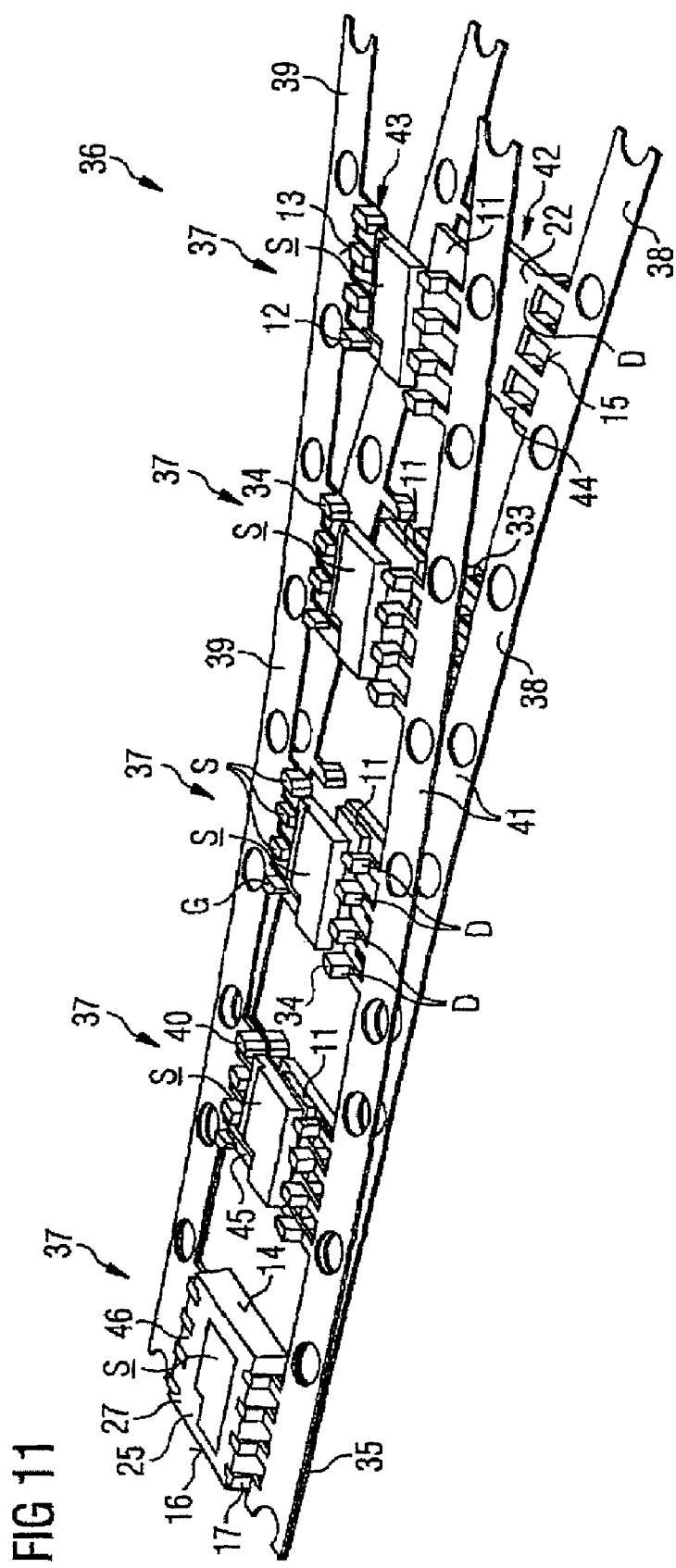
Figure 12:
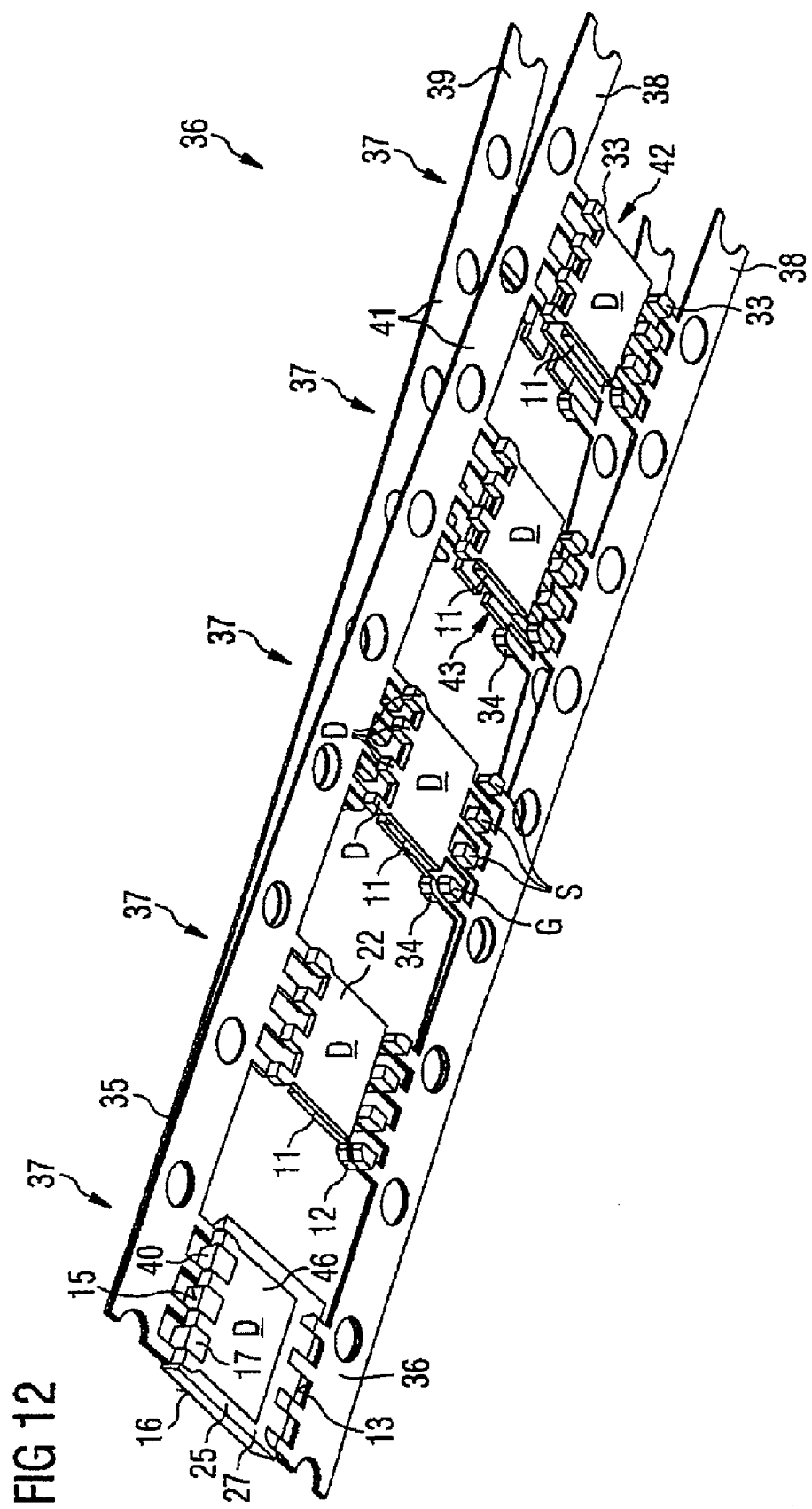

FIG. 11 shows a schematic perspective plan view of two leadframe halves 38 and 39 in the course of joining to form a leadframe 36 with semiconductor devices 46. The lower leadframe half 38 carries a lower large-area external contact 22 and lower through contact block halves 33 which are connected to the large-area lower external contact 22 as drain electrode D on an edge side 15. The lower electrode structure 42 is arranged in each of the semiconductor device positions 37 of the leadframe 36. An upper leadframe half 39 comprises an upper large-area external contact 22 that is adapted to the source electrode S of a semiconductor chip 11 and is electrically connected to three upper through contact block halves 34 on the edge side 13.

A fourth upper through contact block half 34 is reserved for a gate electrode G and is electrically insulated from the rest of the upper through contact block halves 34. The upper through contact block halves 34 are held in position by the upper leadframe half 39, so that when the upper leadframe half 39 is applied to the lower leadframe half 38 with semiconductor chip 11 arranged in between, a stack 41 of leadframe halves with external contact blocks 40 arises which comprises the semiconductor chip 11 in the respective semiconductor device positions 37.

If the leadframe halves 38 and 39 are cohesively connected to one another via a connecting joint 35 and a plastic housing composition 25 is subsequently applied while leaving free the large-area external contacts 22 on the top side and the underside of the semiconductor device 46 and also while leaving free the top side contact areas 19, the underside contact areas 20 and the edge side contact areas 18 of the through contact blocks 17 in each of the semiconductor device positions 37. Subsequently, the semiconductor devices 46 can be stamped out from the leadframe 36.

FIG. 12 shows a schematic perspective bottom view of two leadframe halves 38 and 39 in the course of joining the leadframe halves 38 and 39 to form a leadframe 36 with semiconductor devices 46. Components having the same functions as in FIG. 11 are identified by the same reference symbols and are not discussed separately. It can be seen from this bottom view that the drain external contact D, to which a corresponding semiconductor chip 11 can be applied, is arranged on the lower leadframe half 38.

Figure 13:
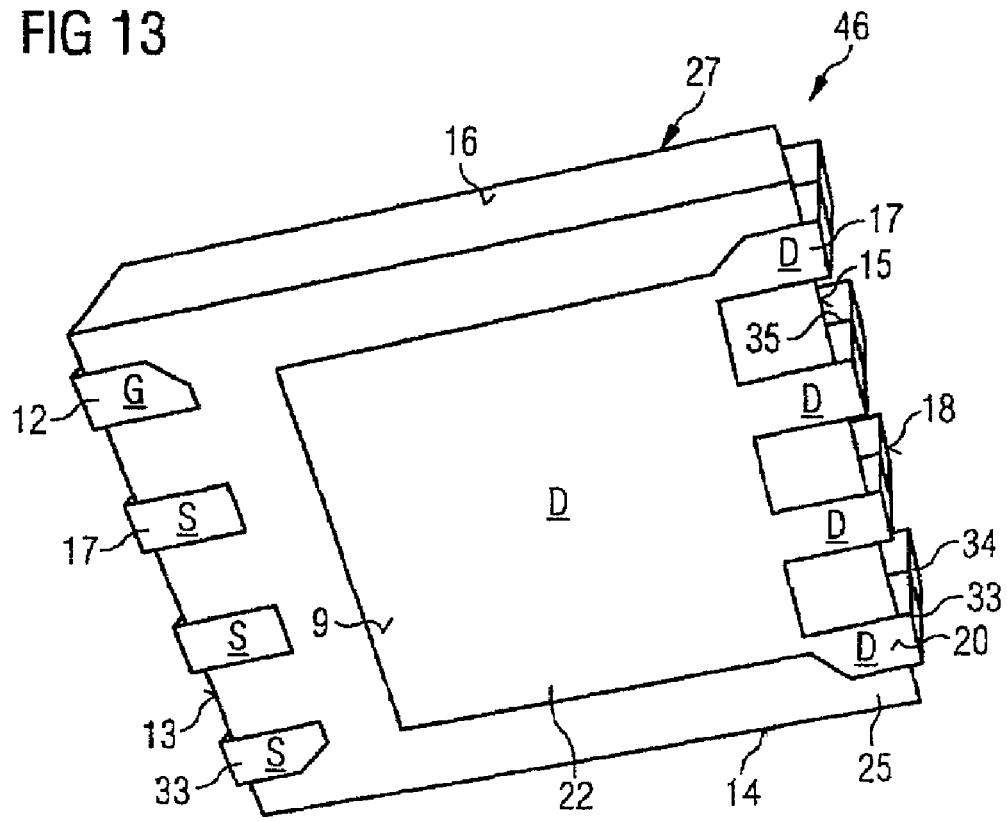

FIG. 13 shows a schematic perspective bottom view of a semiconductor device 46 packaged into a plastic housing composition 25. On the underside, the through contact blocks 17 can be seen on the edge sides 13 and 15, the through contact blocks comprising a lower through contact block half 33 and an upper through contact block half 34 with a horizontal connecting joint 35 arranged in between. The through contact blocks 17 on the edge side 15 merge into a large-area external contact 22, which comprises a drain electrode D in this embodiment. Four underside contact areas 20 can be seen on the edge side 13, of which contact areas three are assigned to the source electrode S and the fourth underside contact area 20 is assigned to the gate electrode G or the control electrode 12.

Figure 14:
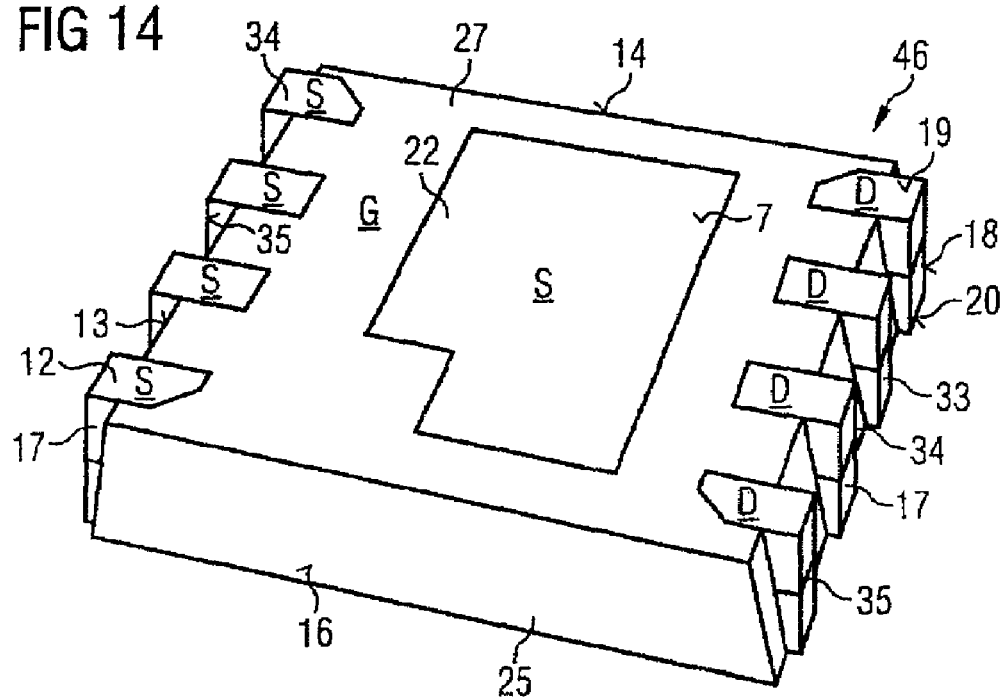

FIG. 14 shows a schematic perspective plan view of the semiconductor device 46 embedded in a plastic housing composition 25. The top side 23 differs from the underside 24 of the semiconductor device 46 by virtue of the fact that three through contact blocks 17 are assigned to the large-area external contact 22 of the source electrode S, and the gate electrode G can be reached only via a through contact block 17 of the edge side 13. In this semiconductor device 46, too, the through contact blocks 17 have been produced by joining together via a connecting joint 35 a lower through contact block half 33 and an upper through contact block half 34.

Figure 15:
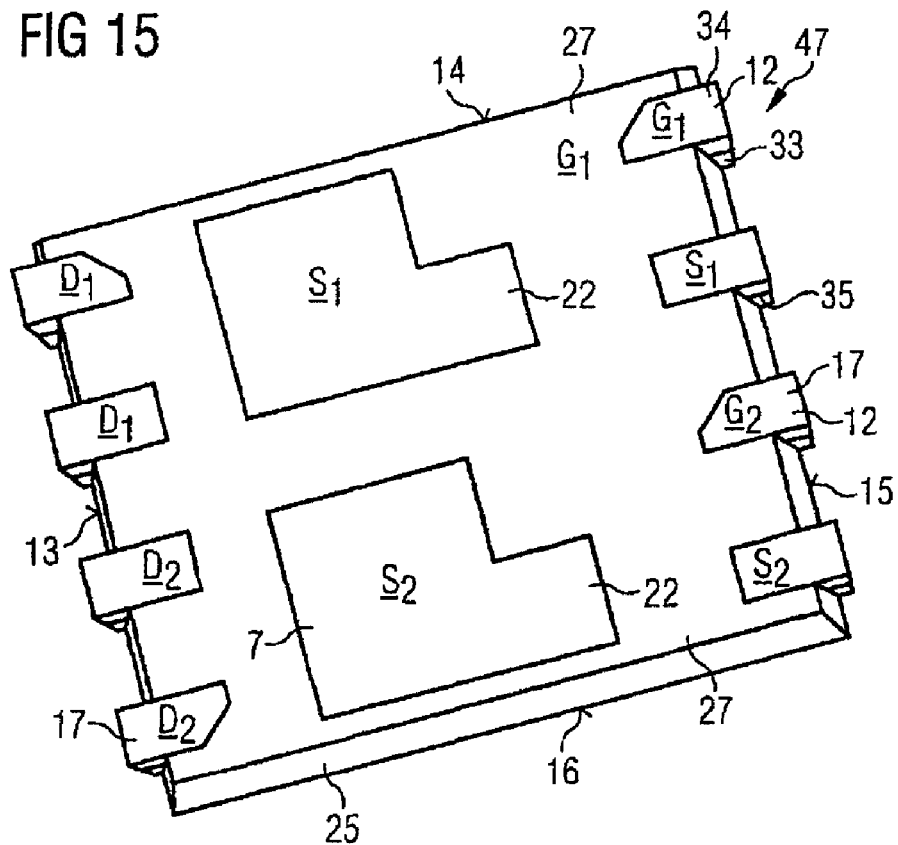
FIG. 15 shows a schematic perspective plan view of the top side of a semiconductor device of a further embodiment of the invention.

FIG. 15 shows a schematic perspective plan view of the top side 23 of a semiconductor device 47 comprising two semiconductor chips, with the result that the top side 23 also comprises two source electrodes $S_1$ and $S_2$. The through contact blocks 17 on the edge side 13 of the semiconductor device 47 are correspondingly divided such that a respective through contact block 17 is assigned to the gate electrodes $G_1$ and $G_2$ and to the source electrodes $S_1$ and $S_2$. On the opposite edge side 15, two through contact blocks are assigned to the drain electrode $D_1$ and two through contact blocks 17 are assigned to the drain electrode $D_2$, with the result that the semiconductor chips arranged alongside one another in this semiconductor device 47 can be driven separately.

Figure 16:
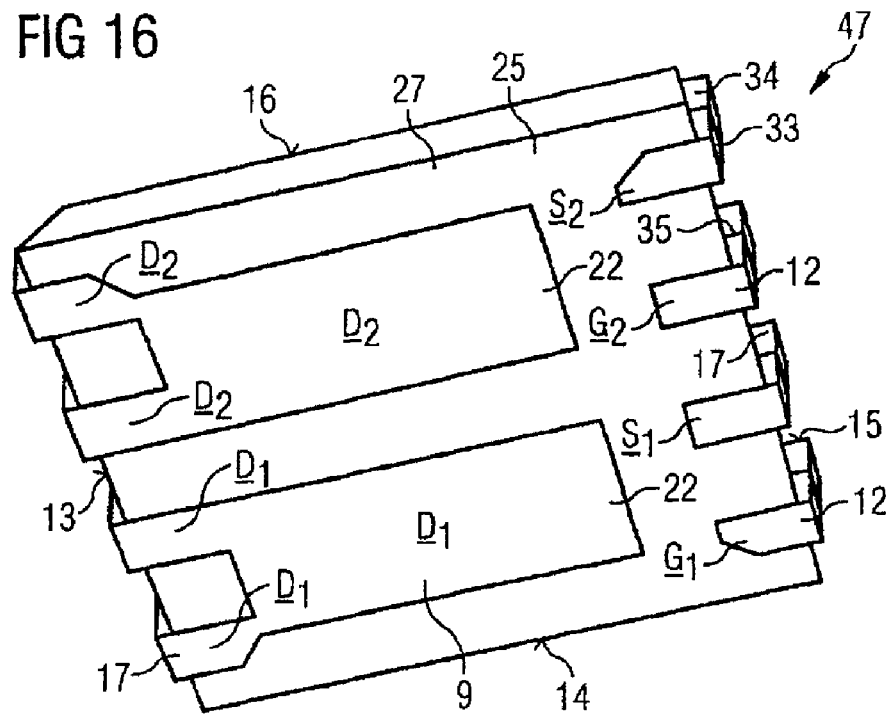
FIG. 16 shows a schematic perspective bottom view of the underside of a semiconductor device in accordance with FIG. 15.

FIG. 16 shows a schematic perspective bottom view of the underside 24 of the semiconductor device 47 in accordance with FIG. 15. The two large-area external contacts 22 on the underside 24 of the semiconductor device 47 are assigned to the two drain electrodes $D_1$ and $D_2$ of the semiconductor chips.

FIGS. 17 to 20 show different schematic views of embodiments of through contact blocks 17 with a horizontal through contact joint 35, the through contact blocks 17 comprising a lower through contact block half 33 and an upper through contact block half 34 and being partly covered by a plastic housing composition 35 with their surfaces. In this case, the through contact blocks 17 supply at least in each case one external contact area 48 on the top side 51 and an external contact area 49 on the underside 52 of the semiconductor device and optionally also an external contact area 53 on one of the edge sides 50 of the semiconductor device.

FIG. 17 shows a perspective schematic view of a two-part through contact block 17 comprising a lower through contact block half 33 and an upper through contact block half 34, which are joined to one another via a horizontal through contact joint 35, in which case a cutout 54 may be filled with plastic housing composition in order to protect the through contact joint 35 on the edge side 53 against damage.

FIG. 18 shows a perspective schematic view of a two-part through contact block 17, cutouts 54 and 55 being filled with plastic housing composition such that a central external contact 50 on the edge side 53 of the semiconductor device is accessible.

Figure 19:
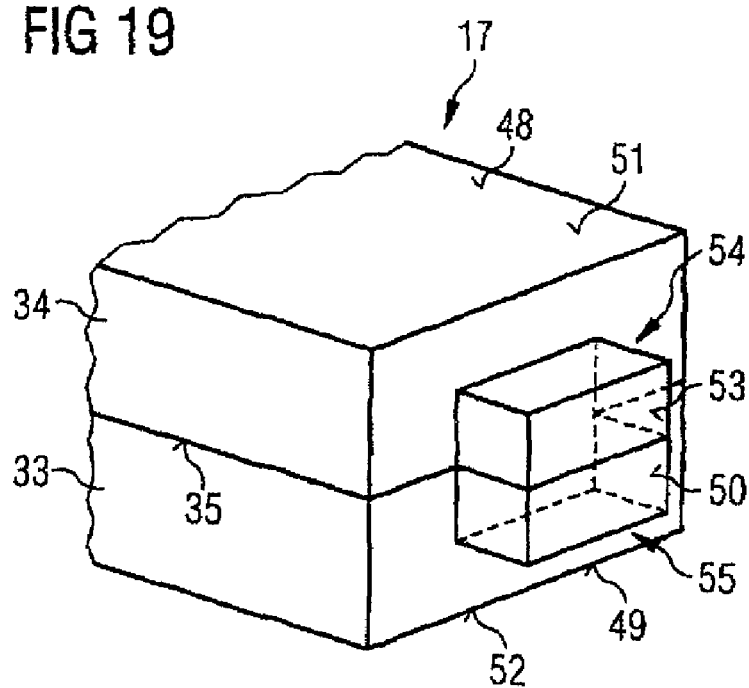

FIG. 19 shows a perspective schematic view of a two-part through contact block, in which case, on the edge side 53, an external contact area 50 that is reduced in size by comparison with FIG. 18 is accessible on the edge side 53 of the semiconductor device.

Figure 20:
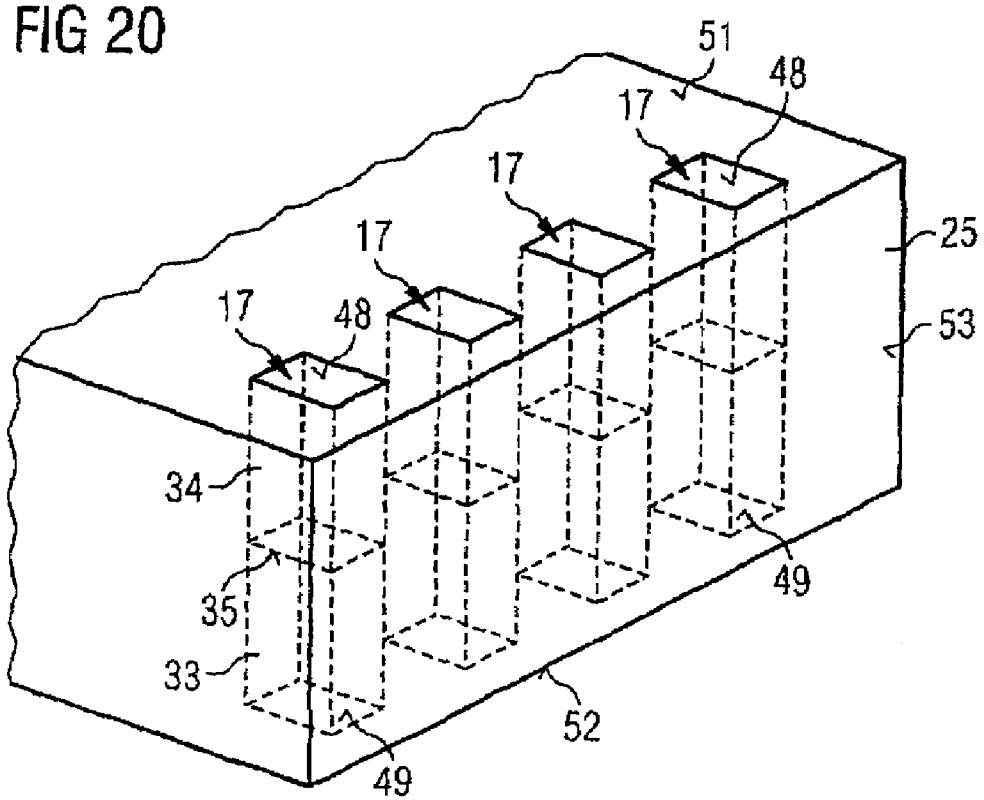

FIG. 20 shows a perspective schematic view of two-part through contacts 17 which are embedded in a plastic housing composition 25 such that external contact areas 48 on the top side 51 and external contact areas 49 on the underside 52 of the semiconductor device are freely accessible.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this stackable semiconductor device and method provided they come within the scope of the appended claims and their equivalents.

What is claimed is:

1. A semiconductor device, comprising:
   a semiconductor chip including: at least one first electrode disposed on a top side of the semiconductor chip, a large-area second electrode disposed on an underside of the semiconductor chip, and a control electrode disposed on the top side or the underside of the semiconductor chip;
   through contact blocks with external contact areas, the through contact blocks being arranged on edge sides of the semiconductor device and being externally accessible via the external contact areas including: at least one edge side contact area, a top side contact area, and an underside contact area;
   a plastic housing having an outer surface that constitutes one of an underside surface and a top side surface of the semiconductor device; and
   at least one large-area external contact having an outer surface that constitutes the other of the underside surface and the top side surface of the semiconductor device,
   wherein the top side contact area of each of the through contact blocks is coplanar with the top side surface of the semiconductor device, and the underside contact area of each of the through contact blocks is coplanar with the underside surface of the semiconductor device.

2. The semiconductor device as claimed in claim 1, wherein the control electrode of the semiconductor chip is electrically connected to one of the through contact blocks.

3. The semiconductor device as claimed in claim 1, wherein the first electrode of the semiconductor chip is electrically connected to at least three through contact blocks.

4. The semiconductor device as claimed in claim 3, wherein the through contact blocks connected to the first electrode are electrically connected to the large-area external contact disposed on the top side or the underside of the semiconductor device.

5. The semiconductor device as claimed in claim 1, wherein the second electrode of the semiconductor chip is electrically connected to at least three through contact blocks.

6. The semiconductor device as claimed in claim 5, wherein the through contact blocks connected to the second electrode are electrically connected to the large-area external contact disposed on the top side or the underside of the semiconductor device.

7. The semiconductor device as claimed in claim 1, wherein:
   the first electrode of the semiconductor chip is electrically connected to at least three through contact blocks;
   the second electrode of the semiconductor chip is electrically connected to at least three through contact blocks; and
   the through contact blocks electrically connected to the first electrode and the through contact blocks electrically connected to the second electrode are arranged on opposing edge sides of the semiconductor device.

8. A power semiconductor module, wherein the power semiconductor module comprises:
   at least one semiconductor device as claimed in claim 1.

9. A hybrid circuit component, wherein the hybrid circuit component comprises:
   at least one semiconductor device as claimed in claim 1.

10. The semiconductor device as claimed in claim 1, further comprising:
    an integrated circuit.

11. A semiconductor device, comprising:
    a semiconductor chip including: at least one first electrode disposed on a top side of the semiconductor chip, a large-area second electrode disposed on an underside of the semiconductor chip, and a control electrode disposed on the top side or the underside of the semiconductor chip;

through contact blocks with external contact areas, the through contact blocks being arranged on edge sides of the semiconductor device and being externally accessible via the external contact areas including: at least one edge side contact area, a top side contact area, and an underside contact area, wherein the through contact blocks comprise: a lower through contact block half and an upper through contact block half, the lower and upper halves being cohesively joined to form a through contact block via a horizontal connecting joint; and at least one large-area external contact arranged on the underside and/or the top side of the semiconductor device.

12. The semiconductor device as claimed in claim 11, wherein the connecting joint comprises a eutectic soldering seam.

13. The semiconductor device as claimed in claim 11, wherein the connecting joint comprises a diffusion solder seam.

14. A semiconductor device, comprising:

a semiconductor chip including: at least one first electrode disposed on a top side of the semiconductor chip, a large-area second electrode disposed on an underside of the semiconductor chip, and a control electrode disposed on the top side or the underside of the semiconductor chip;

through contact blocks with external contact areas, the through contact blocks being arranged on edge sides of the semiconductor device and being externally accessible via the external contact areas including: at least one edge side contact area, a top side contact area, and an underside contact area, wherein the control electrode is electrically connected to two centrosymmetrically opposing through contact blocks; and at least one large-area external contact arranged on the underside and/or the top side of the semiconductor device.

* * * * *